(12) United States Patent
Breitschwerdt et al.

(10) Patent No.: US 6,974,709 B2
(45) Date of Patent: Dec. 13, 2005

(54) METHOD AND DEVICE FOR PROVIDING A SEMICONDUCTOR ETCHING END POINT AND FOR DETECTING THE END POINT

(75) Inventors: Klaus Breitschwerdt, Filderstadt (DE); Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 47 days.

(21) Appl. No.: 10/407,015

(22) Filed: Apr. 3, 2003

(65) Prior Publication Data
US 2003/0224539 A1 Dec. 4, 2003

(30) Foreign Application Priority Data
Apr. 3, 2002 (DE) .......................... 102 14 620

(51) Int. Cl.$^7$ .......................... G01R 31/26; H01L 21/66
(52) U.S. Cl. .......................... 438/14; 438/17; 438/689; 438/706
(58) Field of Search .......................... 438/14, 689, 706, 438/17, 514

(56) References Cited

U.S. PATENT DOCUMENTS 6,127,237 A * 10/2000 Tsuchiaki .................. 438/381
2001/0051437 A1    12/2001 Cruse

FOREIGN PATENT DOCUMENTS

| DD | 241975 | 1/1987 |
|---|---|---|
| DE | 42 41 045 | 5/1994 |
| DE | 10156407 | 6/2003 |
| DE | 101 56 407-4 | 6/2003 |
| JP | 62-115723 | 5/1987 |
| JP | 63-56962 | 3/1988 |
| JP | 11-121573 | 4/1999 |
| JP | 01291429 | 3/2000 |
| WO | PCT/DE01/01031 | 4/2002 |

* cited by examiner

*Primary Examiner*—Thanh Nguyen

(57) ABSTRACT

A method is provided for detecting an end point, a material transition or a boundary surface during the etching of a semiconductor element, a zone of the semiconductor element having non-homogeneous load carrier density and/or non-homogeneous load carrier polarity, particularly a p-n junction, which has an electrical voltage applied to it during etching, and an electrical current induced by it in this zone is measured, and reaching of this zone during etching is determined from a change in the electrical current. This method is suitable for the detection of the etching end point in gas phase etching, in particular with the aid of the etching gases $ClF_3$ and/or $BrF_3$, or in the anisotropic plasma etching of silicon substrates. In addition, a method is provided for etching a semiconductor element using a gaseous etching medium, during which the speed of removal of the semiconductor element is set or changed via a setting of the polarity and/or the density of free load carriers in the semiconductor element. In addition, a device for etching a semiconductor element, which device is suitable for carrying out the two methods described above, is provided.

13 Claims, 1 Drawing Sheet

METHOD AND DEVICE FOR PROVIDING A SEMICONDUCTOR ETCHING END POINT AND FOR DETECTING THE END POINT

FIELD OF THE INVENTION

The present invention relates to a method for recognizing an end point, a material transition or a boundary surface during the etching of a semiconductor element, in particular for etching end point recognition in gas phase etching of silicon substrates, as well as a method for etching a semiconductor element using a gaseous medium, and a device for etching a semiconductor element.

BACKGROUND INFORMATION

When using etching gases such as chlorine trifluoride ($ClF_3$) or bromine trifluoride ($BrF_3$), after the adsorption of these compounds on a silicon surface, by the liberation of fluorine radicals, which react with silicon atoms of the available silicon surface to form spontaneously volatile silicon fluoride compounds, which subsequently leave the surface, silicon is spontaneously etched. This being the case, silicon removal occurs in those places where silicon and the etching gas used come into contact with each other. In this connection, it is known that the etching rate increases with a falling temperature of the silicon surface and a rising partial pressure of the process gas. It is also known that, using these etching methods, removal rates of more than 10 $\mu m$ per minute are possible at correspondingly high pressures in the range of a few mbar to a few 10 mbar, a corresponding material quantity supply of the reactive gas of a few 100 sccm ($cm^3$ of gas flow per minute at a pressure of 1 bar) up to a few slm ($dm^3$ gas flow per minute at a pressure of 1 bar) and a low substrate temperature of, for example, −20° C. to +20° C. The etching continues as long as a suitable process gas and silicon are available.

The explained gas phase etching of silicon using a halogen trifluoride has the advantage of extraordinarily high selectivity compared to most non-silicon materials, so that it is very simple to mask this etching. In particular, even thin photo-resist masks, hard material layers of $SiO_2$, silicon nitride or silicon oxynitride are sufficient as masking layers to define the silicon areas to be etched and the silicon areas not be etched. In practice, such masking layers are not measurably removed, so that even very deep or long silicon etchings are possible without the requirement for thick masking layers.

In addition, it is known that, by a directed supply of the etching gas onto a silicon surface, using, for example, a nozzle or other outflow device, silicon is able to be etched in a locally masked or even unmasked manner, such as by moving the nozzle over the silicon surface. This being the case, it is thereby even possible to "write" in silicon or to "cut" silicon.

In the explained spontaneous gas phase etching of silicon, it is of advantage that no plasma at all or similar activation of the reactive gas is necessary. This being the case, this method gains increased importance in the case of sacrificial layer techniques in silicon micromechanics, particularly for manufacturing cavities and diaphragms, e.g., for pressure sensors, hot film sensors, microphones, etc., as well as generally for structures in which the important thing is not so much a lateral dimensional accuracy, and a certain under-etching of edges is tolerable.

Besides the mentioned high selectivity compared to non-silicon, the advantages of gas phase etching are the simplicity of the etching devices used and the very high removal rates at low gas cost.

However, in using such a method for manufacturing micromechanical structures, such as cavities or diaphragms, a drawback is the fact that a simple and effective etching stop is missing. This being the case, up to this point, a cavity to be generated in a silicon wafer was simply etched so deeply that a hole was created in the wafer, or the creation of a diaphragm or cavity having a defined thickness or depth was performed on a purely time-controlled basis, which is difficult to control and inaccurate.

SUMMARY OF THE INVENTION

The methods according to the present invention and the device according to the present invention capitalize on the fact that the etching removal of semiconductor elements, in particular silicon elements, are substantially dependent upon the charge carrier density and the charge carrier polarity in the etched semiconductor element. In particular, it was surprisingly determined that, in gas phase etching of silicon substrates, n-doped silicon is clearly etched more strongly than p-doped silicon. Therefore, in the method according to the present invention, by a selective setting of a non-homogeneous load carrier density and/or of a non-homogeneous load carrier polarity in a zone of the semiconductor element, the influence of the load carrier polarity and the load carrier density may be used in a simple way to implement a sort of "electrochemical etching stop," as is known from KOH wet etching technology, within the etched semiconductor element or silicon wafer, so that these last items are selectively no longer etched locally or continue being etched only at a considerably reduced rate.

The method according to the present invention is suitable for recognizing an end point of a material transition or a boundary surface within a semiconductor element which stand out by a non-homogeneous load carrier density and/or a non-homogeneous load carrier polarity. As a criterion for reaching these zones, the measuring of an electrical current is suitable, which is induced by applying an electrical voltage to the zone having the non-homogeneous load carrier density and/or non-homogeneous load carrier polarity.

In this context, this induced electrical current changes during etching, and especially increases when, during etching, the zone having the non-homogeneous load carrier density and/or the non-homogeneous load carrier polarity is reached. Accordingly, this current is a very good criterion for monitoring the etching progress, and for determining the etching depth that has been reached in the semiconductor element.

In this connection, during etching of a semiconductor element using a gaseous etching medium, such as bromine trifluoride or chlorine trifluoride, in the case of silicon as the semiconductor element, the speed of removal of the semiconductor element during etching may be set in a very specified way and particularly may also be locally changed by the local setting of the polarity and/or the thickness of the free load carrier in the semiconductor element. Thus, it is possible to change the etching speed and interrupt the etching from place to place in the semiconductor element.

Compared to the related art, the device according to the present invention has the advantage of being very simply constructed and having low investment costs.

The surface-catalytic dissociation of the $ClF_3$ molecule or the $BrF_3$ molecule on a silicon surface or the liberation of fluorine radicals is essentially a function of the available electron density in the silicon, and that in this way the etching removal rate in the silicon may be very simply controlled via the electron density in the semiconductor material. Thus, the method according to the present invention permits advantageously implementing an etching stop in the gas phase etching of silicon with the aid of $ClF_3$ or $BrF_3$, so as to be able to produce, for example, pressure sensor diaphragms of a specified thickness.

In addition, besides providing an etching stop, i.e., the interruption of etching when a zone, layer or island is reached, the position of which may be determined based on its electrical properties, i.e., load carrier density and load carrier polarity, it is advantageously also possible to detect an end point in the etching operation directly via the change in the electrical current when this zone is reached.

Furthermore, detection of an end point, or more generally of a material transition or a boundary surface, during the etching of a semiconductor element, by applying an electrical voltage and measuring an electrical current induced thereby, is a universal method which may be used not only in gas phase etching of silicon with the aid of chlorine trifluoride or bromine trifluoride, but which is also suitable in plasma etching, for example, of the type described in published German patent document DE 42 41 045, for end point detection, such as during diaphragm production.

Thus, the device according to the present invention and the methods according to the present invention permit manufacturing of micromechanical structures that are very economical and sufficiently precise for many applications, in which expensive plasma sources are not necessary, and in which, above all, cost-effective process gases may be used.

DETAILED DESCRIPTION

Figure 1:
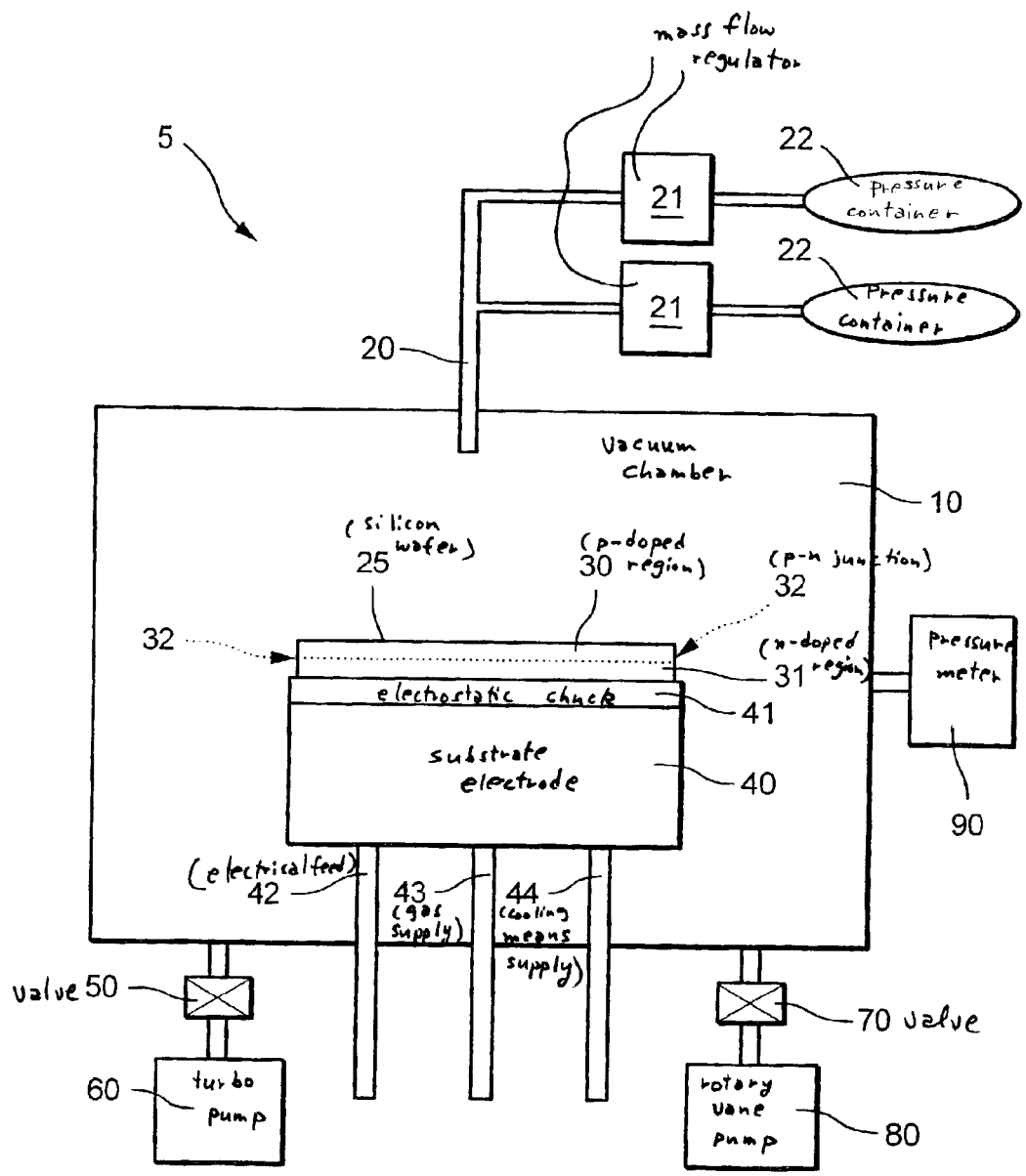
FIG. 1 shows a block diagram of a plasma etching device, for carrying out the method according to the present invention.

FIG. 1 shows an etching device 5 that is suitable for carrying out the method according to the present invention, having a vacuum chamber 10 and a gas inlet 20, the process gas(es) used being supplied to the vacuum chamber 10 from pressure containers 22 via post-connected mass flow regulators 21 via gas inlet 20. In the example explained, the process gas is $ClF_3$, which has a sufficiently high vapor pressure to be supplied via usual mass flow regulators 21, or $BrF_3$, in which case, because of its low vapor pressure of approximately 7 mbar at room temperature, special mass flow regulators 21 are required. By the way, in FIG. 1 it may also be provided that pressure containers 22 and/or the pipes and mass flow regulators 21 are heated, in order to avoid the formation of condensate and/or to increase the vapor pressure of process gas $BrF_3$.

In vacuum chamber 10 used as the process chamber, a substrate electrode 40 is also provided, onto which a silicon wafer 25 is clamped as the semiconductor element. Silicon wafer 25, in the explained example, is particularly homogeneously p-doped, and on its side facing substrate electrode 40 it has a grown n-doped epitaxial layer 31. This being the case, within silicon wafer 25, which is made up of a p-doped region 30 and n-doped epitaxial layer 31, there is present a zone 32 in the form of a p-n junction between p-doped region 30 and n-doped region 31.

In FIG. 1 it is also provided that the clamping of silicon wafer 25 on to substrate electrode 40 is done via a usual electrostatic chuck 41, especially a holding device for silicon wafer 25, an example of which is described in German patent application DE 101 56 407.4, by which the side of silicon wafer 25 lying on substrate electrode 40 is protected from the process gases in vacuum chamber 10. In FIG. 1 it is also provided that contact springs, contact tips, contact needles or, more generally, electrical contacting means starting from substrate electrode 40 extend through electrical chuck 41 or, alternatively, also through a corresponding mechanical clamping device for silicon wafer 25, which are in electrically conducting contact with corresponding contacts on the side of silicon wafer 25 facing substrate electrode 40 and thus contact these electrically. These contact springs or contact tips are used for applying a blocking voltage to p-n junction 32 or zone 32 in silicon wafer 25, which works analogously to that in a diode.

The blocking voltage applied is preferably a direct voltage whose polarity is selected in such a way that the p-n junction carries an electrical current that is as low as possible. Its amplitude is between 5 volts and 30 volts, an electrical voltage that is as high as possible having a more pronounced effect on the etching speed, i.e., it is preferred if the greatest possible electrical voltage, in the individual cases to be empirically determined, is applied, which is strongly dependent upon the wafer material used, for example, upon the quality and the extent of the p-n junction.

According to FIG. 1 it is additionally provided that the side of silicon wafer 25 lying on substrate electrode 40 has helium applied to it via electrostatic chuck 41, in order to achieve good thermal connection of silicon wafer 25 to substrate electrode 40, and at the same time to achieve additional insulation of the lower side of silicon wafer 25 with respect to process gases in vacuum chamber 10. In this manner, one also protects against corrosion of the electrical contacting means connected to silicon wafer 25.

As shown in FIG. 1, substrate electrode 40 also has electrical feeds 42 for the electrical contacting of silicon wafer 25, electrostatic chuck 41 and any provided electrical heating elements, which may be integrated into substrate electrode 40, in order to set the temperature of silicon wafer 25. Electrical feeds 42 are further used for transmitting to the outside an electrical current induced by the electrical voltage applied in the region of zone 32, i.e., the generated p-n junction, which current, because of the polarity of the applied electrical voltage, is a blocking current or a leakage current of a diode, and the transmitted current is measured. For this purpose, outside vacuum chamber 10, usual electrical components are provided, using which, on the one hand, zone 32 is able to have applied to it the desired electrical voltage, and, using which, on the other hand, an electrical current induced in zone 32 by the electrical voltage is able to be measured. In addition, via electrical feeds 42, measured data concerning the temperature of substrate electrode 40 or the helium back face pressure of electrostatic chuck 41 may also be transmitted to the outside.

Substrate electrode 40 also has a gas supply 43, by which preferably helium is supplied, at a preset pressure, as a convection medium for cooling silicon wafer 25 during etching. The pressure of the helium supplied should be greater than the planned process pressure in vacuum chamber 10, i.e., it is, for example, 10 mbar to 20 mbar greater than the process pressure. The helium pressure is preferably carried along with a changing process pressure in vacuum chamber 10, so that there remains always a constant difference. Also shown in FIG. 1 is an optional cooling means supply 44, by which cooling means are able to be supplied to substrate electrode 40 as needed, which circulate in substrate electrode 40 so as to set its temperature and, in particular, to remove the heat of reaction from the exothermic etching reaction which is performed on silicon wafer 25 during etching. The temperature of silicon wafer 25 is preferably at −20° C. to −30° C., so as to achieve optimum etching conditions and optimum mask selectivity. As cooling media, supplied by cooling medium supply 44, Fluorinerts® or an ethylene glycol-water mixture, for example, are suitable.

Finally, etching device 5 has available a rotary vane pump 80 which is advantageously designed as a dry operation pump. This is used to evacuate etching device 5 after an airing and as a process pump to pump off the process gases supplied during the etching. For pressure regulation there is further provided a regulating valve 70, and for pressure measurement a baratron/ionivac is provided as pressure meter 90. Pressure meter 90 and regulating valve 70 are used in the first place for setting as stably as possible the desired process pressure, which is 5 mbar to 100 mbar, preferably 30 mbar, during the processing of silicon wafer 25. Finally, etching device 5 has a turbo pump 60 connected to a shutoff valve 50, which is used to achieve the best possible ending vacuum before and after the processing of silicon wafer 25, particularly a vacuum better than $10^{-4}$ Pa. This is important since, on the one hand, a residual moisture in etching device 5 or on silicon wafer 25 would make the gas phase etching being carried out susceptible to interference, and on the other hand, because remnants of the process gas must be absolutely avoided before unloading silicon wafer 25 from etching device 5.

During etching, turbo pump 60 is shut off from vacuum chamber 10 via shutoff valve 50, because it is not usable for the actual etching process, in view of the process pressures in the mbar range that are used. The etching device according to FIG. 1 may additionally have a load lock set-up, so that one may steer silicon wafer 25 in and out without gas exchange with the surroundings.

To process silicon wafer 25, it is steered into etching device 5 and clamped onto substrate electrode 40 with the aid of electrostatic chuck 41. In this context, silicon wafer 25 is oriented in such a way that appropriately provided contact fields or contact surfaces on the lower side of silicon wafer 25 and contact springs on the upper side of substrate electrode 40 meet each other. After successful clamping, for instance electrostatically, or alternatively mechanically, the side of silicon wafer 25 facing substrate electrode 40 then has helium applied to it and, as explained, a blocking voltage is applied to zone 32, i.e., the p-n junction present there, in the inside of silicon wafer (25). Subsequently, vacuum chamber 10 is evacuated with the aid of turbo pump 60, until the desired base vacuum is attained. Thereafter, shutoff valve 50 is closed. Using mass flow regulators 21, the desired quantity of process gas is now supplied, such as 100 sccm to 1 slm ClF$_3$. In this context, the pressure inside vacuum chamber 10 is constantly measured using pressure meter 90, and is stabilized to the desired value by the combination of rotary vane pump 80 and regulating valve 70. Silicon wafer 25 is now etched spontaneously until an increase in the blocking voltage in the area of p-n junction 32 beyond a preset threshold is measured with the aid of a current-measuring unit (not shown), which is connected to electrical supply 42 and, via it, to zone 32. This increase in the blocking voltage above a preset threshold value signals that n-doped epitaxial layer 31 has been reached, i.e., that p-doped area 30 of silicon wafer 25 has been etched through. After the threshold value of the blocking voltage has been exceeded, the process gas supply is first stopped, and then vacuum chamber 10 is evacuated. Finally, turbo pump 60, with shutoff valve 50 open, takes over pumping off to an ending pressure that is as low as possible, so that when the ending pressure is reached, silicon wafer 25 may be unloaded from etching device 5 with the aid of a load lock device (not shown) in FIG. 1.

The method according to the present invention is explained further using the example of p-doped silicon wafer 25 as in FIG. 1, on which, on one side n-doped epitaxial layer 31 has been grown, whose thickness may correspond, for example, to a later desired diaphragm thickness for a pressure sensor.

In order to etch a cavity from the reverse side of silicon wafer 25, i.e., the side of silicon wafer 25 facing away from n-doped epitaxial layer 31, this side is first masked, for example, using a photo resist mask, so that only those surface areas of silicon wafer 25 are open, and thus accessible to the etching gas used, where the desired cavity is to form. For the etching itself, silicon wafer 25 is then placed "face down," i.e., with n-doped epitaxial layer 31 facing downward, on substrate electrode 40, via which both n-doped epitaxial layer 31 and the p-doped are a 30 of silicon wafer 25 are electrically contacted. For this, on the substrate electrode side, the aforementioned spring pins or other types of electrical contacts are provided, whereas silicon wafer 25 has available contact fields allocated above these. Now, during etching, p-doped area 30 has a negative electrical voltage applied to it and n-doped epitaxial layer 31 has a voltage applied to it that is positive compared to the former. The planar pn-diode formed by p-doped area 30 and n-doped epitaxial layer 31 is thus polarized in the blocking direction, so that only a very low blocking current is able to flow, and even high voltages may be applied up to the breakdown limit of the diode. In this context, the electrical potential at which silicon wafer 25 is, as a whole, is not significant, but only potential differences within silicon wafer 25, i.e., in the area of zone 32, are significant.

Into p-doped areas 30 of silicon wafer 25 negative load carriers (electrons) are injected by the polarized pn-diode, as explained, or by the thus polarized p-n junction in zone 32, while n-doped epitaxial layer 31 is depleted of electrons which are extracted by the voltage source connected via electrical supply 42.

In this context, the negative load carriers are beneficial to the gas phase etching, since they support the surface-catalytic dissociation of the ClF$_3$ or BrF$_3$, while a shortage of electrons correspondingly slows down the etching.

Thus, when the etching front reaches n-doped epitaxial layer 31 after etching through p-doped areas 30 or silicon materials in the cavity region, etching at that point is slowed down by the predominant load carrier depletion zone or rather is brought to a standstill depending on the extent of the load carrier depletion. At the same time, p-n junction 32, which first lay inside silicon wafer 25, and thus was protected from the surroundings, is exposed, i.e., as a result of the opening of p-n junction 32, there now frequently appear leakage currents which are measured via an appropriate current measuring unit and with the aid of electrical supply 42, and are able to be drawn upon as indicator of the end of the etching process, i.e., in the example explained, the reaching of n-doped epitaxial layer 31.

Thus, using the explained method, a diaphragm having a specified thickness which corresponds to the thickness of n-doped epitaxial layer 31 may be produced, wherein the exceeding of the blocking current of a predefined threshold value is utilized as the break-off criterion.

Therefore, at the end of the process, on the one hand, etching is slowed down or even stopped entirely when the electrically biased p-n junction is reached, and on the other hand, a decision is derived from the increase in the leakage current flowing through p-n junction 32 to terminate further processing by stopping the gas supply of the reactive gas to silicon wafer 25, evacuating etching device 5 and unloading silicon wafer 25. Thus, on the one hand, when the etching target zone is reached, automatic reduction in the etching rate is achieved, and on the other hand, an indicator for terminating the process is provided, i.e., an etching end point detection.

The explained detecting of the increase of the leakage current when the etching front has reached a p-n junction provided in the silicon wafer 25, or, more generally, a zone 32 having non-homogeneous load carrier density and/or non-homogeneous load carrier polarity, is universally applicable and is not limited only to the gas phase etching of silicon using $ClF_3$ or $BrF_3$. Rather, it is also suitable as end point detection in plasma etching, when, for example, a cavity is to be etched using the anisotropic plasma etching process, e.g., according to published German patent document DE 42 41 045, to a certain depth and an exactly predetermined diaphragm thickness. Naturally, in this case, the reaching of p-n junction 32 does not lead to an automatic etching stop at n-doped epitaxial layer 31; rather, the stepwise increase in the leakage current because of the "damaged" or partially etched p-n junction, i.e., zone 32, may continue to be drawn upon as a criterion for the breaking off of the etching process.

In the above explained plasma etching process, it may be advantageous if the process has been previously optimized with respect to the setting of maximum uniformity over the entire surface of silicon wafer 25, as is described, for instance in published International Patent application PCT/DE 01/01031, so that one may reach the etching end point everywhere on the surface of silicon wafer 25 as much as possible at the same time.

Using the method explained above, it is possible to control the reaching of the etching end point not only via the process time, but also by utilizing the blocking current via the p-n junction in silicon wafer 25 as an unequivocally detectable breaking off criterion.

What is claimed is:

1. A method for detecting one of an end point, a material transition and a boundary surface during a gas phase etching of a semiconductor element, a zone of the semiconductor element having at least one of non-homogeneous load carrier density and non-homogeneous load carrier polarity in the region of one of the end point to be detected, the material transition to be detected, and the boundary surface to be detected, comprising:

applying an electrical voltage to the zone of the semiconductor element during the gas phase etching with at least one of $ClF_3$ gas and $BrF_3$ gas as an etching gas; and measuring an electrical current induced in the zone, wherein etching progress reaching the zone having at least one of the non-homogeneous load carrier density and the non-homogeneous load carrier polarity is determined from a change in the electrical current.

2. The method according to claim 1, wherein the zone having at least one of the non-homogeneous load carrier density and the non-homogeneous load carrier polarity is in the form of one of a layer and an island.

3. The method according to claim 1, wherein the zone having at least one of the non-homogeneous load carrier density and the non-homogeneous load carrier polarity is a p-n junction.

4. The method according to claim 3, wherein the electrical voltage applied is a direct voltage polarized in such a way that the p-n junction is blocked, and wherein the electrical current is one of a blocking current and a leakage current of the p-n junction.

5. The method according to claim 1, wherein the semiconductor element has an n-doped area and a neighboring p-doped area that form the zone having at least one of the non-homogeneous load carrier density and the non-homogeneous load carrier polarity, and wherein the electrical voltage is applied in such a way that negative load carriers are injected from the p-doped area into the n-doped area.

6. The method according to claim 4, wherein an increase in one of the blocking current and the leakage current of the p-n junction above a threshold value is used as an indication that etching progress has reached the p-n junction.

7. The method according to claim 1, further comprising:

one of stopping the etching and modifying the etching with regard to process parameters used in the etching, after the measured change in the electrical current.

8. A method for etching a semiconductor element using at least one of gaseous $ClF_3$ and $BrF_3$ as an etching medium, comprising:

varying a speed of removal of the semiconductor element that occurs at least in some portions of the semiconductor element by local setting of at least one of polarity and density of free load carriers in the semiconductor element.

9. The method according to claim 8, wherein the speed of the removal of the semiconductor element that occurs at least in some portions is varied by applying an electrical voltage to a zone in the semiconductor element having at least one of non-homogeneous load carrier density and non-homogeneous load carrier polarity.

10. The method according to claim 9, wherein the zone is a p-n junction.

11. The method according to claim 9, further comprising:

measuring an electrical current induced by the electrical voltage in the zone during etching, wherein etching progress reaching the zone in the semiconductor element is determined from a change in the induced electrical current.

12. The method according to claim 11, wherein the zone is a p-n junction and the electrical voltage is a direct voltage polarized in such a way that the zone is blocked, and wherein the electrical current is one of a blocking current and leakage current of the p-n junction.

13. The method according to claim 12, wherein the change in the electrical current is used for detection of one of an end point, a material transition and a boundary surface in the semiconductor element.

* * * * *